(12) United States Patent
Chen et al.

(10) Patent No.: US 9,135,112 B2
(45) Date of Patent: Sep. 15, 2015

(54) POLICY FOR READ OPERATIONS ADDRESSING ON-THE-FLY DECODING FAILURE IN NON-VOLATILE MEMORY

(71) Applicant: Seagate Technology LLC, Cupertino, CA (US)

(72) Inventors: Zhengang Chen, San Jose, CA (US); Earl T. Cohen, Oakland, CA (US); Jeremy Werner, San Jose, CA (US); Erich F. Haratsch, Bethlehem, PA (US)

(73) Assignee: Seagate Technology LLC, Cupertino, CA (US)

( * ) Notice: Subject to any disclaimer, the term of this patent is extended or adjusted under 35 U.S.C. 154(b) by 57 days.

(21) Appl. No.: 13/804,671

(22) Filed: Mar. 14, 2013

(65) Prior Publication Data

US 2014/0164881 A1    Jun. 12, 2014

Related U.S. Application Data

(60) Provisional application No. 61/735,908, filed on Dec. 11, 2012.

(51) Int. Cl.

| G11C 29/00 | (2006.01) |
|---|---|
| G06F 11/10 | (2006.01) |
| G06F 11/16 | (2006.01) |
| G11C 16/00 | (2006.01) |
| G11C 29/02 | (2006.01) |
| G11C 29/52 | (2006.01) |
| G06F 11/20 | (2006.01) |
| G11C 29/04 | (2006.01) |

(52) U.S. Cl.
CPC ........ *G06F 11/1068* (2013.01); *G06F 11/1666* (2013.01); *G11C 16/00* (2013.01); *G11C 29/028* (2013.01); *G11C 29/52* (2013.01); *G06F 11/20* (2013.01); *G11C 2029/0409* (2013.01); *G11C 2029/0411* (2013.01)

(58) Field of Classification Search
None
See application file for complete search history.

(56) References Cited

U.S. PATENT DOCUMENTS

| 6,041,001 | A  * | 3/2000 | Estakhri ........................ 365/200 |
|---|---|---|---|
| 7,949,830 | B2 | 5/2011 | Allen et al. .................... 711/137 |
| 8,151,062 | B2 | 4/2012 | Krishnaprasad et al. ...... 711/143 |
| 8,245,101 | B2 | 8/2012 | Olbrich et al. ................ 714/753 |
| 8,321,645 | B2 | 11/2012 | Rabii et al. ..................... 711/165 |
| 8,826,105 | B2 * | 9/2014 | Yen et al. ....................... 714/776 |
| 2010/0269018 | A1 * | 10/2010 | Clark et al. ..................... 714/763 |
| 2011/0055660 | A1 * | 3/2011 | Dudeck et al. ................. 714/763 |
| 2012/0240007 | A1 * | 9/2012 | Barndt et al. .................. 714/758 |
| 2013/0061087 | A1 * | 3/2013 | Kopylovitz .................... 714/6.3 |
| 2013/0275986 | A1 * | 10/2013 | Yen et al. ....................... 718/103 |
| 2014/0068365 | A1 * | 3/2014 | Chen et al. ..................... 714/746 |
| 2014/0082459 | A1 * | 3/2014 | Li et al. .......................... 714/773 |

* cited by examiner

*Primary Examiner* — Daniel McMahon
(74) *Attorney, Agent, or Firm* — Christopher P. Maiorana, PC

(57) ABSTRACT

An apparatus includes a non-volatile memory and a controller. The controller is operatively coupled to the non-volatile memory and configured to perform read and write operations on the non-volatile memory using codewords as a unit of read access. The controller includes an error correction engine configured to perform an error correction on codewords read from the non-volatile memory, and, if the error correction fails, to perform one or more retry procedures. The controller is further configured to perform one or more background procedures as a result of the error correction or one or more of the retry procedures not being successful and send an error message as a result of all of the retry procedures not being successful. The one or more background procedures are directed to determining a cause of the error correction failure.

20 Claims, 6 Drawing Sheets

POLICY FOR READ OPERATIONS ADDRESSING ON-THE-FLY DECODING FAILURE IN NON-VOLATILE MEMORY

FIELD OF THE INVENTION

The invention relates to non-volatile memory management generally and, more particularly, to a method and/or apparatus for implementing a policy for read operations addressing on-the-fly decoding failure in non-volatile memory (NVM).

BACKGROUND

A solid-state drive (SSD)/non-volatile memory controller sits between a host and a non-volatile memory, such as flash memory. A non-volatile memory read request may originate externally from the host or internally from the controller. Typically the purpose of the read request is to retrieve some data stored in the non-volatile memory. A primary task of a read policy is to return the correct data. To ensure the data stored on the non-volatile memory is returned corrected (without errors), error correction codes (ECC) are used. An ECC decoder in the controller corrects the raw data read from the non-volatile memory. Various ECC codes can be used, such as BCH (Bose Chaudhuri Hocquenghem) code, LDPC (low-density parity-check) code, and convolutional codes. The ECC decoder operates on the granularity of a codeword (of fixed or variable size), referred to as an e-page.

Under normal conditions, the ECC decoder can correct errors in the raw e-page using on-the-fly decoding and return the corrected e-page (and/or other requested data, such as statistics) immediately. In such cases, the read operation for the particular e-page is considered complete. As flash memory, for example, scales below 30 nm, and moves towards more bits per cell, such on-the-fly decoding may not be successful when the data stored in the flash memory suffers from a number of noise sources such as program and erase (P/E) cycling (endurance), retention, cell-to-cell coupling, read disturb, etc. Flash memory vendors have started providing retry read commands to be used when on-the-fly read decoding fails. The controller can also perform various retry tasks when on-the-fly read decoding fails. Examples of the retry tasks are: additional reads with the same or different reference voltage (Vref), ECC re-decoding of different decoder inputs and/or parameters, digital signal processing techniques, higher-level redundancy functions using a redundancy code such as a RAID-like code, etc. However, any retry takes extra time and therefore incurs a penalty in performance. If retry happens too frequently or retry takes too long, the incurred performance loss becomes unacceptable.

It would be desirable to have a policy for read operations addressing on-the-fly decoding failure in non-volatile memory (NVM).

SUMMARY

The invention concerns an apparatus includes a non-volatile memory and a controller. The controller is operatively coupled to the non-volatile memory and configured to perform read and write operations on the non-volatile memory using codewords as a unit of read access. The controller includes an error correction engine configured to perform an error correction on codewords read from the non-volatile memory, and, if the error correction fails, to perform one or more retry procedures. The controller is further configured to perform one or more background procedures as a result of the error correction or one or more of the retry procedures not being successful and send an error message as a result of all of the retry procedures not being successful. The one or more background procedures are directed to determining a cause of the error correction failure.

BRIEF DESCRIPTION OF THE FIGURES

Embodiments of the invention will be apparent from the following detailed description and the appended claims and drawings in which:

DETAILED DESCRIPTION OF EMBODIMENTS

Embodiments of the invention include providing a method and/or apparatus for implementing a policy for non-volatile memory (NVM) read operations that may (i) comprises a foreground flow and a background flow, (ii) provide a background flow configured to determine a cause of a current read failure, (iii) based on a cause of a read failure, take measures to ensure that when the same e-page, or a larger granularity, such as host page, page, or block, is read in the future, on-the-fly decoding does not fail again due to the same reason that caused failure in the current read, (iv) identify non-volatile memory wear and adapt ECC code rate as necessary, (v) provide a background flow including procedures to achieve one or more of page-level recycling, noise source identification, identification of page-to-page variation, and/or code rate adjustment, and/or (vi) improve performance of future reads. Possible causes of read failure can include, but are not limited to: page-to-page variation (outlier pages), retention, P/E cycling, read disturb, out-dated channel tracking results, etc. The controller in accordance with embodiments of the invention generally spends extra time and/or power to determine a cause of a read failure. However, it may not always be possible to identify the true cause with reasonable efforts.

Figure 1:
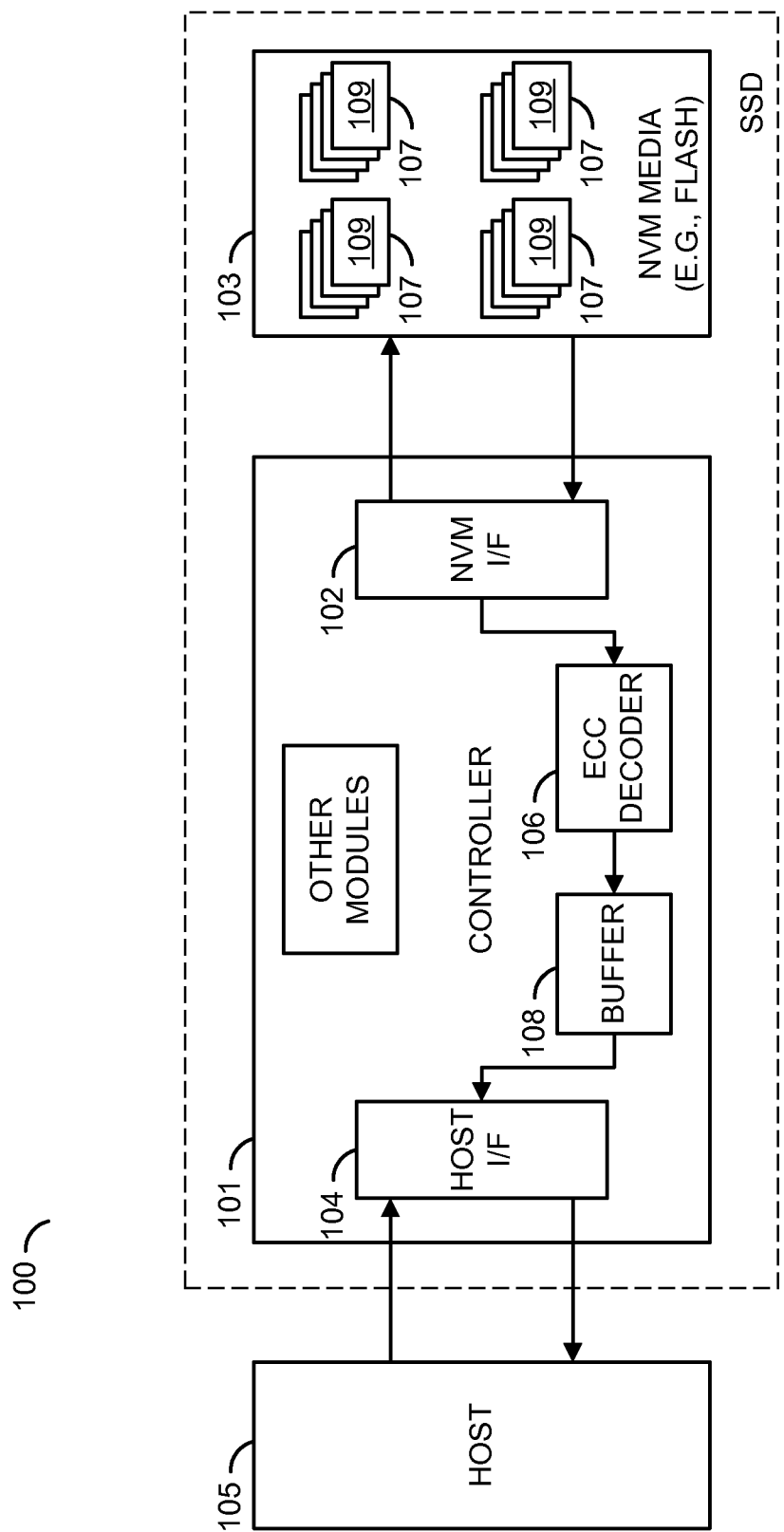
FIG. 1 is a diagram illustrating a SSD/non-volatile memory controller in accordance with an embodiment of the invention.

Referring to FIG. 1, a diagram is shown illustrating a non-volatile memory system 100 in accordance with an embodiment of the invention. In various embodiments, the non-volatile memory system 100 comprises a block 101, a block 103, and a block 105. The block 101 comprises a memory controller implementing a read policy in accordance with an embodiment of the invention. The block 103 comprises a non-volatile memory (NVM) media. The block 105 comprises a host.

The controller 101 may be configured to control one or more individual non-volatile memory lanes. In some embodiments, the controller 101 may implement multiple memory lane controller instances to control a plurality of non-volatile memory lanes. The controller 101 has a non-volatile memory interface 102 configured to couple the controller 101 to the non-volatile memory media 103. The non-volatile memory media 103 may comprises one or more non-volatile memory devices 107. The non-volatile memory devices 107 have, in some embodiments, one or more non-volatile memory die 109. According to a type of a particular one of the non-volatile memory devices 107, a plurality of non-volatile memory die 109 in the particular non-volatile memory device 107 are optionally and/or selectively accessible in parallel. The non-volatile memory devices 107 are generally representative of one type of storage device enabled to communicatively couple to controller 101. However, in various embodiments, any type of storage device is usable, such as SLC (single level cell) NAND flash memory, MLC (multi-level cell) NAND flash memory, TLC (triple level cell) NAND flash memory, NOR flash memory, read-only memory (ROM), static random access memory (SRAM), dynamic random access memory (DRAM), magneto-resistive random-access memory (MRAM), ferromagnetic memory (e.g., FeRAM, F-RAM FRAM, etc.), phase-change memory (e.g., PRAM, PCRAM, etc.), racetrack memory (or domain-wall memory (DWM)), resistive random-access memory (RRAM or ReRAM), or any other type of memory device or storage medium.

In some embodiments, the controller 101 and the non-volatile memory media 103 are implemented on separate integrated circuits. When the controller 101 and the non-volatile memory media 103 are implemented as separate integrated circuits (or devices), the non-volatile memory interface of the controller 101 is generally enabled to manage a plurality of data input/output (I/O) pins and a plurality of control I/O pins. The data I/O pins and the control I/O pins may be configured to connect the device containing the controller 101 to the external device(s) forming the non-volatile memory media 103. In various embodiments, the controller 101 is implemented as an embedded controller. In various embodiments, the controller 101 and the NVM media 103 implement a solid-state drive (SSD).

The controller 101 also has a command interface 104 configured to receive commands and send responses to the host 105. In embodiments implementing a plurality of non-volatile memory lanes, the controller 101 also includes multiplexing circuitry coupling the multiple instances of memory lane controllers to a back-end processing unit (BEPU) providing scheduling and/or data management of the plurality of non-volatile memory devices 107. In further embodiments, the BEPU comprises data buffering and direct memory access (DMA) engines to store data or other information and to move the data or other information between the host 105 and the NVM media 103 using one or more memory lane controllers within the controller 101.

When a non-volatile memory read operation is performed (e.g., in response to a request originating either externally from the host or internally from the controller) raw data is retrieved from the NVM media 103. To ensure the data returned is correct, an ECC decoder 106 in the controller 101 corrects the raw data read from the NVM media 103. Various ECC codes can be used, such as BCH (Bose Chaudhuri Hocquenghem) codes, LDPC (low-density parity-check) code, turbo codes, polar codes, and convolutional codes. The ECC decoder 106 operates on the granularity of a codeword (of fixed or variable size), referred to as an e-page.

Under normal conditions, the ECC decoder 106 can correct errors in the raw e-page using on-the-fly (or dynamic) decoding and return the corrected e-page (and/or other requested data, such as statistics) immediately (e.g., via a buffer 108). In such cases, the read operation for the particular e-page is considered complete. The controller 101 can perform various retry tasks when on-the-fly read decoding fails. Examples of the retry tasks are: additional reads with the same or different reference voltage (Vref), ECC re-decoding of different decoder inputs and/or parameters, digital signal processing techniques, higher-level redundancy functions using a redundancy code such as a RAID-like code, etc. In addition to the retry tasks, the controller 101 can perform a variety of background tasks to determine the cause of a read failure.

Figure 2:
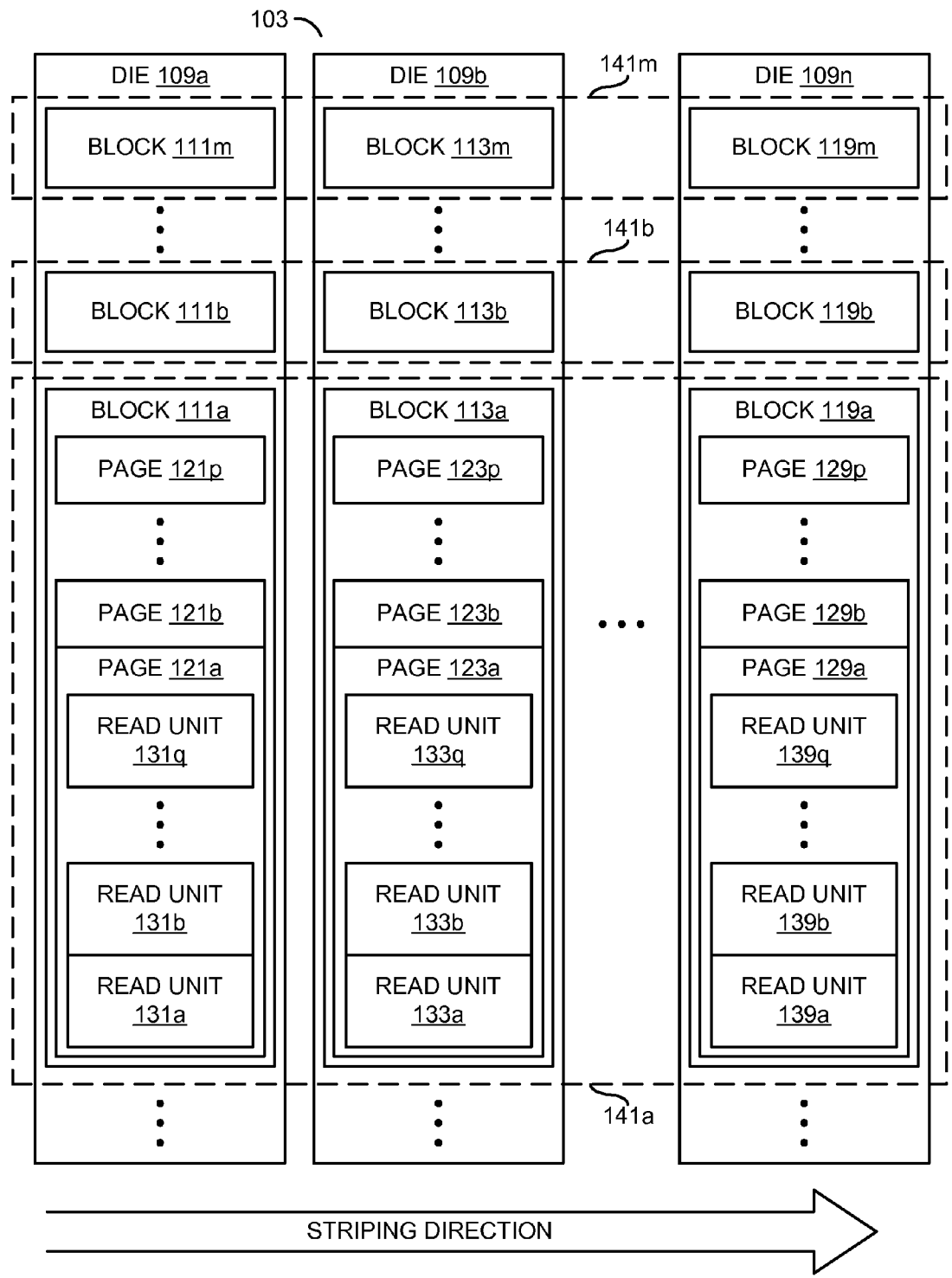
FIG. 2 is a diagram illustrating selected details of an embodiment of die, R-blocks, blocks, R-pages, pages, and e-pages of multiple non-volatile memory devices.

Referring to FIG. 2, a diagram of an example implementation of the NVM media 103 of FIG. 1 is shown illustrating selected details of an embodiment of die, R-blocks, blocks, R-pages, pages, and e-pages of multiple non-volatile memory devices. In one example, the NVM media 103 may comprise multiple non-volatile memory devices embodying a number of blocks, pages, and read units (or e-pages). For example, devices 109a-109n correspond to respective ones of one or more individual non-volatile memory die. In some embodiments, NVM devices 109a-109n are a portion of the NVM media 103. For example, in various embodiments, data is striped independently across multiple groups of devices, where each of the groups of devices is independently accessible.

Each NVM device (e.g., any one of the devices 109a, 109b, ..., and 109n) provides storage organized as a plurality of NVM blocks (e.g., blocks 111a, 111b, ..., and 111m of device 109a; blocks 113a, 113b, ..., and 113m of device 109b; and so forth). The NVM blocks in turn include a plurality of NVM pages (e.g., pages 121a, 121b, ..., and 121p of block 111a; pages 123a, 123b, ..., and 123p of block 113a; and so forth). The NVM pages in turn comprise a plurality of read units (e.g., read units 131a, 131b, ..., and 131q of page 121a; read units 133a, 133b, ..., and 133q of page 123a; and so forth). Reads and/or writes of information in the devices are performed according to an order, such as a 'read unit first' order or a 'page first' order. An example of a read unit first order for read units illustrated in FIG. 2 begins with read unit 131a followed by units 133a, ..., 139a, 131b, 133b, ..., 139b, and so forth, ending with unit 139q. An example of a page first order for read units illustrated in FIG. 2 begins with read unit 131a followed by units 131b, ..., 131q, 133a, 133b, ..., 133q, 139a, 139b, and so forth, ending with unit 139q.

In various embodiments, the NVM blocks of the NVM media 103 are organized as a plurality of R-blocks (e.g., R-blocks 141a, 141b, ..., 141m). The R-blocks are used as a unit of allocation. The R-blocks comprise n blocks from each die (n being most typically 1 or 2 with, for example, current flash devices). In some embodiments, there are b R-blocks (0 to b−1), and R-block k comprises the k'th block from each die. In other embodiments, there are b/2 R-blocks, and R-block k comprises the k'th block and the k+b/2'th block from each die.

The non-volatile memory die 109a-109n comprise a number of planes (e.g., one, two, four etc.). Each plane comprises a number (e.g., 512, 1024, 2048, etc.) of NVM blocks. Each of the NVM blocks comprises a number of pages, such as 128, 256, or 512 pages. A page is generally the minimum-sized unit that can be independently written, and a block is generally the minimum-sized unit that can be independently erased. In various embodiments, each page of the non-volatile memory devices 109a-109n comprises a plurality of read units, which may also be referred to as ECC-pages or simply e-pages. Each e-page is an amount of user data and the corresponding ECC data that, together, comprise one ECC codeword (e.g., a correctable unit). Typically, there are an integer number of e-pages per NVM page, or in some embodiments, per multi-plane page. The e-pages are the basic unit that can be read and corrected, hence e-pages are also called "read units." Typically, read units may have 1 KB or 2 KB of user data, and an even share of the remaining bytes in the non-volatile memory page (so that all read units in a same one of the multi-plane pages are the same total size). An e-page (or read unit) is thus the minimum-sized unit that can be independently read (and ECC corrected).

Some non-volatile memory die, such as flash die, generally enable multi-plane operations—operating on one or more of the planes in parallel—which improves bandwidths. For this reason, the term NVM block as used herein generally refers to a multi-plane block, such as one block from each of the planes, and the term page as used herein generally refers to a multi-plane page, such as one page from each of the planes. In various embodiments, R-blocks may comprise one or more multi-plane blocks from each die. The R-blocks in turn comprise a plurality of R-pages. An R-page comprises 1 (multi-plane) page from each of the (multi-plane) blocks in the R-block. In some embodiments, there are p R-pages (0 to p−1) and R-page j comprises the j'th page from each of the blocks in the R-block.

The term host page is used to distinguish that the mapping between logical blocks (e.g., SATA sectors) used by the host and physical locations in the non-volatile memory is on a granularity that is optionally larger than that of the logical blocks. For example, in some usage scenarios, eight consecutive logical blocks are treated as one host page (e.g., eight, consecutive 512B BATA sectors are treated as a 4 KB unit) for purposes of mapping logical block addresses to physical locations in the non-volatile memory.

Figure 3:
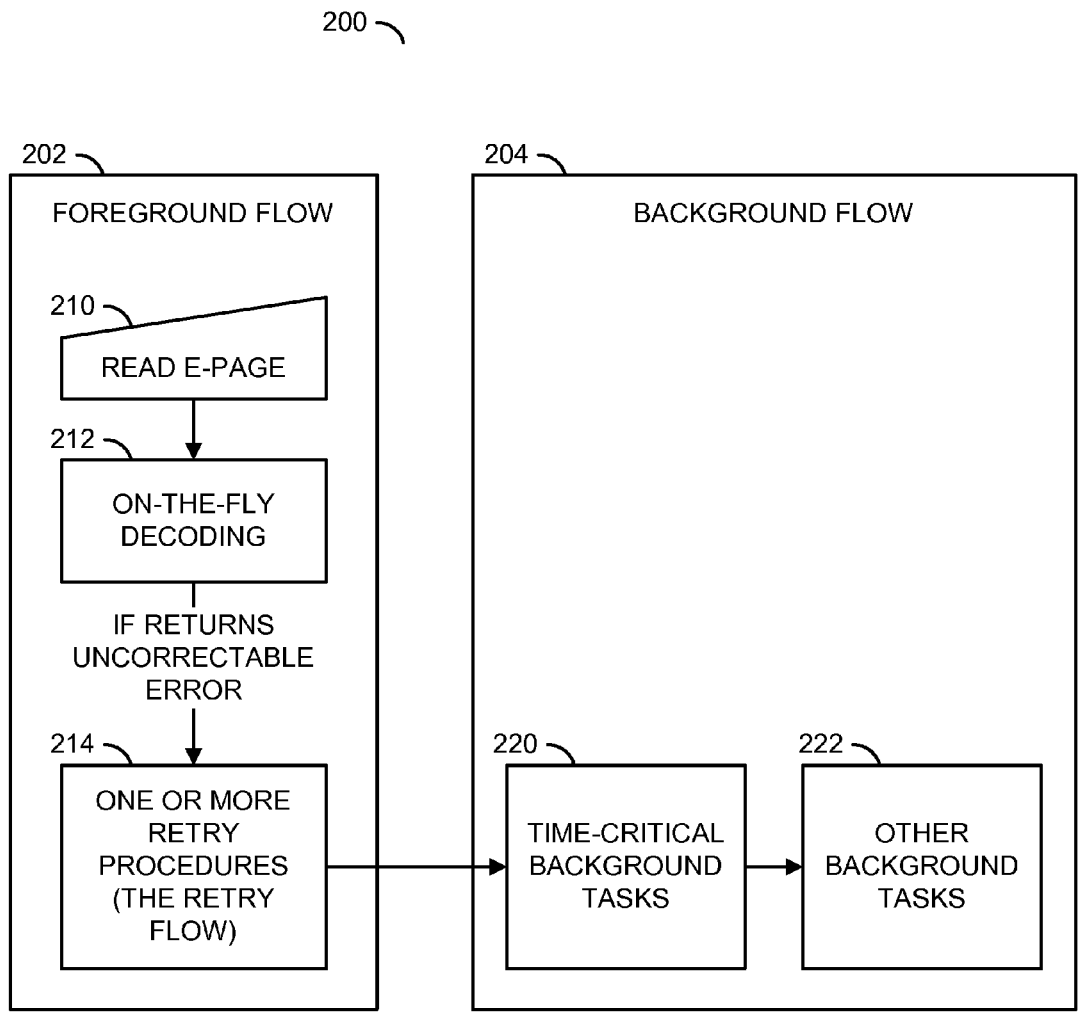
FIG. 3 is a diagram illustrating a read policy in accordance with an embodiment of the invention.

Referring to FIG. 3, a diagram is shown illustrating a simplified view of a read policy 200 in accordance with an embodiment of the invention. Embodiments of the invention generally include a system-level policy for non-volatile memory read operations. A non-volatile memory read is typically in response to a host request that requires the controller to return data to the host. Due to program/erase (P/E) cycling and other noise factors, a read operation may involve many different procedures to return the correct data as well as performing maintenance tasks. A non-volatile memory read policy in accordance with an embodiment of the invention contains two categories of tasks: foreground and background. Foreground tasks focus on making the best effort to correctly read the data requested on-the-fly (the first time); background tasks focus on identifying the cause of on-the-fly read failure (if there is any) and taking measures to avoid such failures for future reads on the same or greater granularity.

The read policy 200 is composed of two main flows: a foreground flow 202 and a background flow 204. In various embodiments, multiple threads may be running in parallel. Background and foreground tasks for different non-volatile memory locations may be running in a mixed fashion. The primary target of the foreground flow 202 is to complete the read request (by the host or the controller) and return the requested data back to the requester. The requested data is typically the corrected e-page data. In some cases, for example, statistics collection non-volatile memory reads, the requested data can be statistics generated by processing activities of the read policy. Sometimes, ECC decoding does not even need to be done, if only some raw data is requested. The read policy 200 is generally applied only to read operations that involve ECC decoding.

The foreground flow 202 generally comprises a read operation 210, a dynamic (on-the-fly) decoding operation 212 and one or more retry procedures 214. In the read operation 210, a raw e-page (or page) is read from non-volatile memory. After the raw e-page (or page) is read, the e-page (or page) is sent to the ECC decoder, where the on-the-fly ECC decoding operation 212 is performed. If the ECC decoder returns correctable error, e.g., decodes successfully, everything is normal and the read operation is able to complete. The background flow 204 is not needed unless explicitly requested. If the on-the-fly decoding operation 212 fails, the foreground flow 202 tries to recover the data with a series of retry procedures 214 (described below in connection with FIG. 5). If the series of retry procedures 214 are not successful, an error message is sent to the requester. If one of the retry procedures 214 is successful, the read operation is able to complete. According to various embodiments, if one, some, all, or specific ones of the retry procedures 214 are used, the background flow 204 is used to determine a likely cause of the current on-the-fly read failure.

The targets of the background flow 204 include the following: Determining the cause of a current read failure; Based on the determined cause, taking measures to ensure that when the same e-page, or a larger granularity, such as host page, page, or block, is read in the future, on-the-fly decoding does not fail again due to the same reason that caused failure in the current read; Identifying non-volatile memory wear and adapting an ECC code rate as necessary. Possible causes of read failure include: page-to-page variation (e.g., outlier pages), retention, P/E cycling, read disturb, out-dated channel tracking results, etc. The controller needs to spend extra time and/or power to determine the cause of the current read failure, and it may not always be possible to identify the true cause with reasonable efforts. Bad block identification and management are also part of the target of the background flow 204.

The terminology "background" is used herein to indicate that the procedure(s) is(are) not directly related to the read request and/or any specific host request. The term background is orthogonal to the time/latency requirement of each procedure. For example, some background procedures can be categorized as time-critical tasks 220, and others (e.g., other background tasks 222) can be done in a less time-critical manner. In general, the designation of a procedure as time-critical is just an example of prioritizing and/or ordering different background procedures and is not meant to be limiting. The controller is generally enabled to schedule background tasks in various ways to achieve the same targets. For example, time-critical tasks may include tasks that need information that is currently available as a result of the current read (e.g., data, Vref, statistics, etc.) but is not practical to store or maintain for an extended period of time.

In some embodiments, the procedures available in the background flow to achieve the above targets may include, but are not limited to page-level recycling, noise source identification, identification of page-to-page variation, and code rate adjustment. When on-the-fly decoding of one e-page fails, the controller recycles the host page (or page) that contains the e-page. Recycling means writing the data somewhere else in the non-volatile memory and updating the map (from logical to physical pages). Recycling ensures that when the same host data is read again, the controller will not enter retry for the same cause. Page-level recycling is a non-trivial thing to do, especially when compression is used. An e-page may contain multiple host pages that need to be recycled. Or a host page may span multiple e-pages. Either case leads to complications in recycling a host page based on e-page failure.

One or more noise source identification procedures may be used to differentiate failures due to transient noise from those due to non-transient noise. Transient noise refers to noise that can be eliminated by erasing and reprogramming the portion of the non-volatile memory (e.g., a block) that had the failure, while non-transient noise cannot be so eliminated. Examples of transient noise include read disturb and retention. Examples of non-transient noise include P/E cycling noise. Sometimes outlier pages can also be categorized as non-transient noise. In some embodiments, the one or more noise source identification procedures can include, but are not limited to a retention test and a read disturb test. The retention test comprises a procedure to determine whether a R-block suffers from long retention. The read disturb test comprises a procedure to determine whether a block suffers from excessive amount of read disturb.

A non-volatile memory channel (e.g., error characteristics) varies from die to die, block to block, and page to page. The controller tracks the channel condition. However, due to limited resources, it is prohibitive to track the channel on a page-to-page basis. For example, a tracking module may identify an optimized reference voltage (e.g., Vref) for each block or R-block. However, the single reference voltage may be sub-optimal for some outlier pages. A procedure may be implemented to identify such page-to-page variations. In one example, the identification of page-to-page variation is based on two parameters: the page-level optimal Vref (e.g., obtained either in the foreground flow 202 or in a dedicated procedure in the background flow 204), and the optimal Vref for the channel tracking unit (block or R-block). If a difference between the page-level optimal Vref and the optimal Vref for the channel tracking unit is larger than a predetermined (or determined) threshold, the page is likely to be an outlier page.

If the failure is due to some noise effect that is not fixable by erasing/reprogramming or adjusting controller parameters, and the noise effect is evident on the granularity of code rate adjustment (e.g., block), the controller can enter an adaptive code rate adjustment procedure to lower the code rate for the code rate granularity (e.g., the block). An example of an adaptive code rate adjustment procedure can be found in co-pending U.S. application Ser. No. 13/798,696, filed Mar. 13, 2013, entitled "ERROR CORRECTION CODE RATE MANAGEMENT FOR FLASH MEMORY," which is incorporated herein by reference. If the controller finds the code rate indeed needs to be lowered, the controller changes the code rate for the block. In the worst case, the block is retired (e.g., the block is marked as a bad block and a bad block management module of the controller takes over the bad block).

Figure 4:
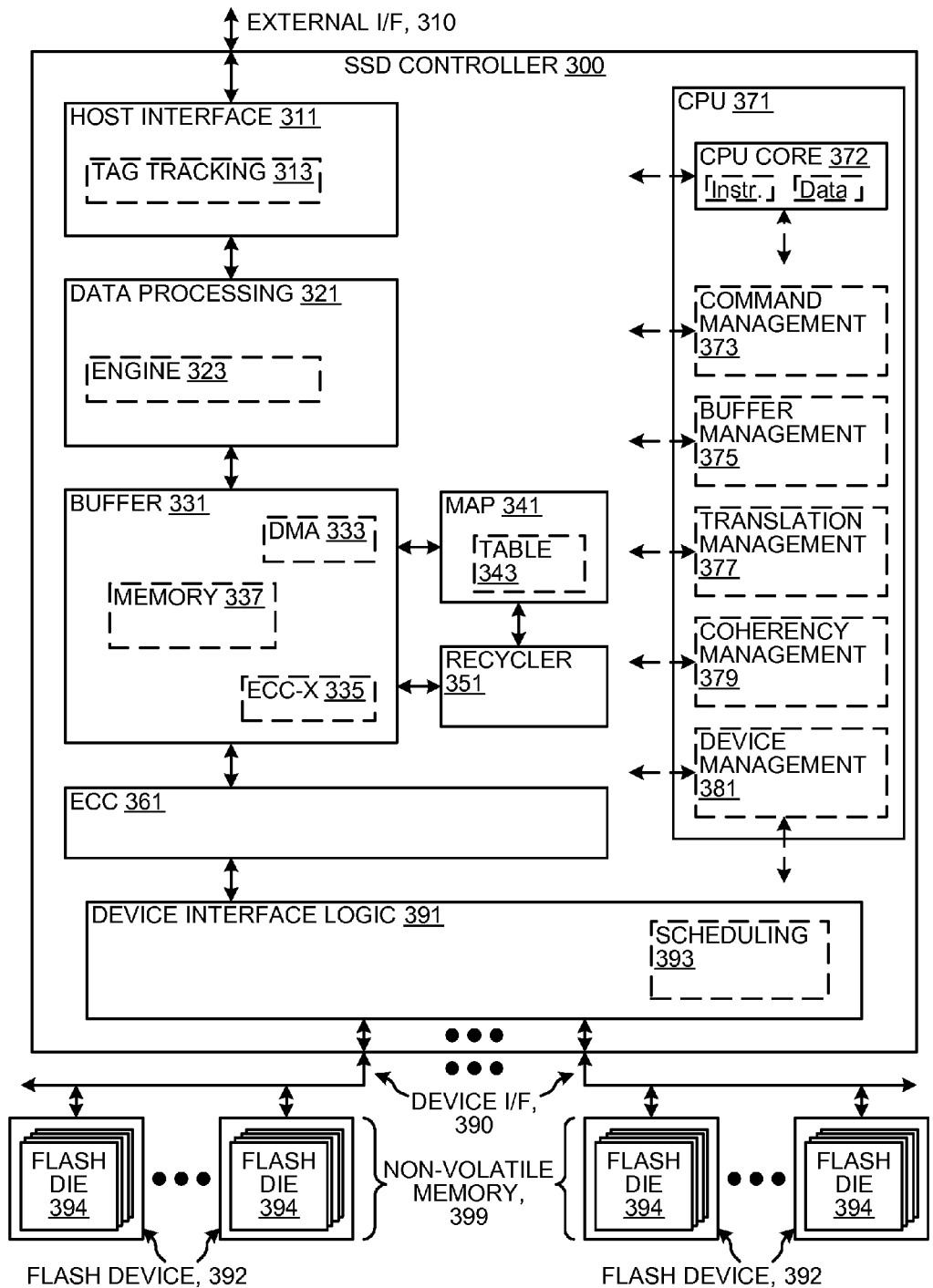
FIG. 4 is a diagram illustrating a non-volatile memory controller in accordance with an embodiment of the invention.

Referring to FIG. 4, a diagram is shown illustrating a solid-state disk (SSD) including an SSD controller 300 in which a read policy in accordance with an embodiment of the invention may be implemented to determine a cause of program error in a non-volatile (e.g., flash) memory before an error rate becomes too high to correct. The SSD controller 300 may be coupled via one or more external interfaces 310 to a host (not shown). According to various embodiments, external interfaces 310 are one or more of: a SATA interface; a SAS interface; a PCIe interface; a Fibre Channel interface; an Ethernet Interface (such as 10 Gigabit Ethernet); a non-standard version of any of the preceding interfaces; a custom interface; or any other type of interface used to interconnect storage and/or communications and/or computing devices. For example, in some embodiments, the SSD controller 300 includes a SATA interface and a PCIe interface.

The SSD controller 300 is further coupled via one or more device interfaces 390 to non-volatile memory 399 including one or more storage devices, such as non-volatile memory devices 392. According to various embodiments, device interfaces 390 are one or more of: an asynchronous interface; a synchronous interface; a DDR synchronous interface; an ONFI compatible interface, such as an ONFI 2.2 compatible interface; a Toggle-mode compatible flash interface; a non-standard version of any of the preceding interfaces; a custom interface; or any other type of interface used to connect to storage devices.

The non-volatile memory devices 392 have, in some embodiments, one or more individual non-volatile memory die 394. According to a type of a particular one of the non-volatile memory devices 392, a plurality of non-volatile memory die 394 in the particular non-volatile memory device 392 are optionally and/or selectively accessible in parallel. The non-volatile memory devices 392 are generally representative of one type of storage device enabled to communicatively couple to SSD controller 300. However, in various embodiments, any type of storage device is usable, such as an SLC (single level cell) NAND flash memory, MLC (multi-level cell) NAND flash memory, TLC (triple level cell) NAND flash memory, NOR flash memory, read-only memory (ROM), static random access memory (SRAM), dynamic random access memory (DRAM), magneto-resistive random-access memory (MRAM), ferromagnetic memory (e.g., FeRAM, F-RAM FRAM, etc.), phase-change memory (e.g., PRAM, PCRAM, etc.), racetrack memory (or domain-wall memory (DWM)), or any other type of memory device or storage medium.

According to various embodiments, the device interfaces 390 are organized as: one or more busses (e.g., lanes) with one or more non-volatile memory devices 392 per bus (lane); one or more groups of busses with one or more non-volatile memory devices 392 per bus, where busses in a group are generally accessed in parallel; or any other organization of non-volatile memory devices 392 coupled to device interfaces 390.

The SSD controller 300 may have one or more modules, such as a host interface module 311, a data processing module 321, a buffer 331, a map 341, a recycler 351, an error-correcting code (ECC) module 361, a central processing unit (CPU) 371, and device interface logic 391. The specific modules and interconnections illustrated in FIG. 4 are merely representative of one embodiment, and many arrangements and interconnections of some or all of the modules, as well as additional modules not illustrated, may be implemented to meet the design criteria of a particular implementation. In a first example, in some embodiments, there are two or more host interfaces 311 to provide dual-porting. In a second example, in some embodiments, the data processing module 321 and/or the ECC module 361 are combined with the buffer 331. In a third example, in some embodiments, the host interfaces 311 are directly coupled to the buffer 331, and the data processing module 321 optionally and/or selectively operates on data stored in the buffer 331. In a fourth example, in some embodiments, the device interface logic 391 is directly coupled to the buffer 331, and the ECC module 361 optionally and/or selectively operates on data stored in the buffer 331.

The host interface 311 sends and receives commands and/or data via the external interface 310, and, in some embodiments, tracks progress of individual commands via the tag tracking module 313. For example, the commands include a read command specifying an address (such as a logical block address (LBA)) and an amount of data (such as a number of LBA quanta, e.g. sectors) to read; in response the SSD provides read status and/or read data. For another example, the commands include a write command specifying an address (such as an LBA) and an amount of data (such as a number of LBA quanta, e.g. sectors) to write; in response the SSD provides write status and/or requests write data and optionally subsequently provides write status. In some embodiments, the host interface 311 is compatible with a SATA protocol and, using NCQ commands, is enabled to have up to 32 pending commands, each with a unique tag represented as a number from 0 to 31. In some embodiments, the tag tracking module 313 is enabled to associate an external tag for a command received via the external interface 310 with an internal tag used to track the command during processing by SSD controller 300.

According to various embodiments, one or more of: data processing module 321 optionally and/or selectively processes some or all data sent between the buffer 331 and the external interfaces 310; and data processing module 321 optionally and/or selectively processes data stored in the buffer 331. In some embodiments, the data processing module 321 uses one or more engines 323 to perform one or more of: encrypting; decrypting; compressing; decompressing; formatting; reformatting; transcoding; and any other data processing and/or manipulation task.

The buffer 331 stores data sent to/from the external interfaces 310 from/to the device interfaces 390. In some embodiments, the buffer 331 additionally stores system data, such as some or all map tables, used by the SSD controller 300 to manage the non-volatile memory devices 392. In various embodiments, the buffer 331 has one or more of: a memory 337 used for temporary storage of data; a direct memory access (DMA) modules 333 used to control movement of data to and/or from the buffer 331; an ECC-X module 335 used to provide a higher-level error correction function; and other data movement and/or manipulation functions. An example of a higher-level error correction function is a RAID-like capability, where redundancy is at a non-volatile memory device (e.g. multiple ones of the non-volatile memory devices 392) level and/or a non-volatile memory die (e.g. non-volatile memory die 394) level instead of at a disk level.

According to various embodiments, one or more of: the ECC module 361 optionally and/or selectively processes some or all data sent between the buffer 331 and the device interfaces 390; and the ECC module 361 optionally and/or selectively processes data stored in the buffer 331. In some embodiments, the ECC module 361 implements one or more of: a CRC (cyclic redundancy check) code; a Hamming code; an RS (Reed-Solomon) code; a BCH (Bose Chaudhuri Hocquenghem) code; an LDPC (Low-Density Parity Check) code; a Viterbi code; a trellis code; a hard-decision code; a soft-decision code; an erasure-based code; any error detecting and/or correcting code; and any combination of the preceding.

The device interface logic 391 controls the non-volatile memory devices 392 via the device interfaces 390. The device interface logic 391 is enabled to send data to/from the non-volatile memory devices 392 according to a protocol of the non-volatile memory devices 392. The device interface logic 391 includes a scheduling module 393 to selectively sequence control of the non-volatile memory devices 392 via the device interfaces 390. For example, in some embodiments, the scheduling module 393 is enabled to queue operations to the non-volatile memory devices 392, and to selectively send the operations to individual ones of the non-volatile memory devices 392 (or the non-volatile memory die 394) as individual non-volatile memory devices 392 (or non-volatile memory die 394) are available.

The map 341 converts between data addressing used on the external interfaces 310 and data addressing used on the device interfaces 390, using table 343 to map external data addresses to locations in the non-volatile memory 399. For example, in some embodiments, the map 341 converts logical block addresses (LBAs) used on the external interfaces 310 to block and/or page addresses targeting one or more non-volatile memory die 394, via mapping provided by table 343. In some embodiments, a granularity of map 341 is fixed, such as mapping first fixed-sized logical blocks used on the external interfaces 310 to second fixed-sized blocks used on the device interfaces 390. In other embodiments, a granularity of map 341 is variable and not all blocks used on either the external interfaces 310 or the device interfaces 390 are necessarily a same size.

In some embodiments, table 343 associates logical page addresses with a respective map entry, where the logical page addresses are a portion of and/or are derived from the LBA, and the map entry identifies a portion of the non-volatile memory. For example, in some embodiments, the logical page address is a higher-order portion of the LBA, and a lower-order portion of the LBA is an offset within a logical page specified by the logical page address.

In some embodiments, the map entry identifies the portion of the non-volatile memory as a base address, such as a read unit address, and a length, such as a number of read units. In some embodiments, the read units are sequential in locations in an address space of the non-volatile memory. In further embodiments, the read units are striped across a plurality of non-volatile memory die (such as non-volatile memory die 394) and/or non-volatile memory devices (such as non-volatile memory devices 392).

In some embodiments, map 341 uses table 343 to perform and/or to look up translations between addresses used on the external interfaces 310 and data addressing used on the device interfaces 390. According to various embodiments, table 343 is one or more of: a one-level map; a two-level map; a multi-level map; a map cache; a compressed map; any type of mapping from one address space to another; and any combination of the foregoing. According to various embodiments, table 343 includes one or more of: static random access memory (SRAM); dynamic random access memory (DRAM); non-volatile memory (such as flash memory); cache memory; on-chip memory; off-chip memory; and any combination of the foregoing.

In some embodiments, the recycler module 351 performs garbage collection. For example, in some embodiments, non-volatile memory devices 392 contain blocks that must be erased before the blocks are re-writeable. The recycler module 351 is enabled to determine which portions of the non-volatile memory devices 392 are actively in use, such as by scanning a map maintained by map 341, and to make unused portions of non-volatile memory devices 392 available for writing by erasing them. In further embodiments, the recycler module 351 is enabled to move data stored within the non-volatile memory devices 392 to make larger contiguous portions of the non-volatile memory devices 392 available for writing.

The CPU 371 controls various portions of SSD controller 300. The CPU 371 includes a CPU core 372. The CPU core 372 is, according to various embodiments, one or more single-core or multi-core processors. The individual processor cores in the CPU core 372 are, in some embodiments, multi-threaded. The CPU core 372 includes instruction and/or data caches and/or memories. For example, the instruction memory contains instructions to enable the CPU core 372 to execute software (sometimes called firmware) to control the SSD controller 300. In some embodiments, some or all of the firmware executed by the CPU core 372 is stored on the non-volatile memory devices 392.

In various embodiments, the CPU 371 further includes: a command management module 373 to track and control commands received via the external interfaces 310 while the commands are in progress; a buffer management module 375 to control allocation and use of the buffer 331; a translation management module 377 to control the map 341; a coherency management module 379 to control consistency of data addressing and to avoid conflicts such as between external data accesses and recycle data accesses; a device management module 381 to control device interface logic 391; and optionally other management units. In one example, the device management module 381 may be configured to initiate and/or implement a read policy, such as read policy 200, in accordance with embodiments of the invention. None, any, or all of the management functions performed by the CPU 371 are, according to various embodiments, controlled and/or managed by hardware, by firmware, by software (such as software executing on the CPU core 372 or on a host connected via the external interfaces 310), or any combination thereof. For example, the recycler module 351 and the device management module 381 may be implemented as part of the CPU 371, or could be implemented in hardware, or could be implemented by a combination of firmware running on the CPU 371 and hardware.

In some embodiments, the CPU 371 is enabled to perform other management tasks, such as one or more of: gathering and/or reporting performance statistics; implementing SMART; controlling power sequencing, controlling and/or monitoring and/or adjusting power consumption; responding to power failures; controlling and/or monitoring and/or adjusting clock rates; and other management tasks.

Various embodiments include a computing-host non-volatile memory controller that is similar to the SSD controller 300 and is compatible with operation with various computing hosts, such as via adaptation of the host interface 311 and/or the external interface 310. The various computing hosts include one or any combination of a computer, a workstation computer, a server computer, a storage server, a PC, a laptop computer, a notebook computer, a netbook computer, a PDA, a media player, a media recorder, a digital camera, a cellular handset, a cordless telephone handset, and an electronic game.

In various embodiments, all or any portion of an SSD controller 300 (or a computing-host non-volatile memory controller) are implemented on a single integrated circuit (IC), a single die of a multi-die IC, a plurality of dice of a multi-die IC, or a plurality of ICs. For example, the buffer 331 is implemented on a same die as other elements of the SSD controller 300. For another example, the buffer 331 is implemented on a different die than other elements of SSD controller 300.

Figure 5:
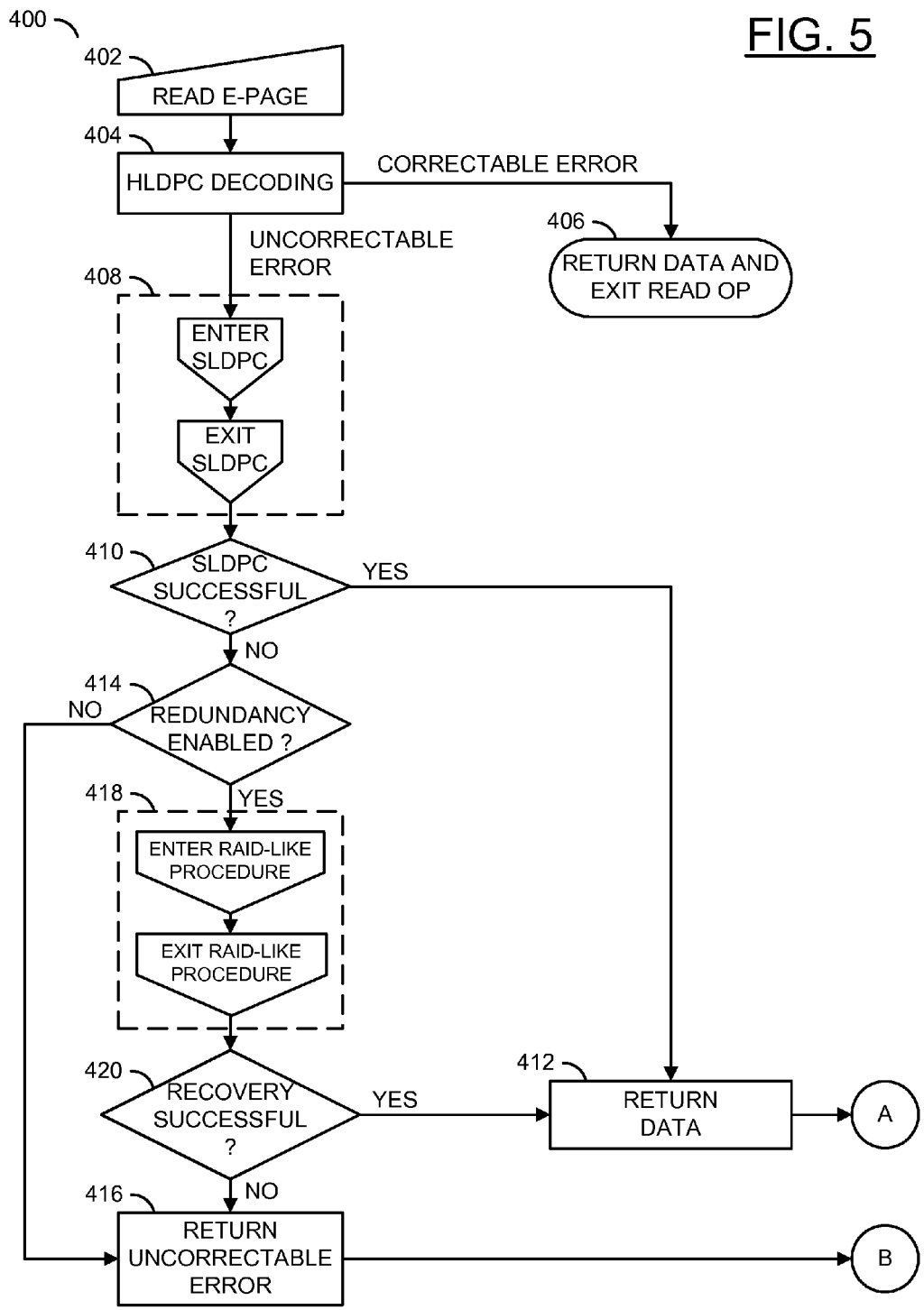
FIG. 5 is a flow diagram illustrating a foreground process in accordance with an embodiment of the invention.

Referring to FIG. 5, a flow diagram of a process 400 is shown illustrating an example foreground flow of a read policy in accordance with an embodiment of the invention. In some embodiments, the process 400 may comprise a step (or state) 402, a step (or state) 404, a step (or state) 406, a step (or state) 408, a step (or state) 410, a step (or state) 412, a step (or state) 414, a step (or state) 416, a step (or state) 418, and a step (or state) 520. In the step 402, the process 400 reads an e-page (or page). In the step 404, the process 400 performs an ECC check using on-the-fly decoding such as hard-decision low-density parity check (HLDPC). However, other ECC can be used. If the on-the-fly decoding finds that the raw data is correct or there is a correctable error, the process 400 moves to the step 406, where the data is returned to the requester and the read operation is exited.

If the on-the-fly decoding finds that the raw data has an uncorrectable error, the process 400 moves to the 408 to begin a series of retry operations. In the step 408, the process 400 performs a soft-decision decoding procedure, for example by using read retry to obtain one or more additional samples of the e-page (or page) and using soft-decision low-density parity check (SLDPC) decoding. Digital signal processing (DSP) routines are optionally and/or selectively included in the step 408. When the SLDPC and DSP routines have been performed, the process 400 moves to the step 410 where a determination is made whether the step 408 was successful in recovering the data. If the recovery was successful, the process 400 moves to the step 412. Otherwise, the process 400 continues the series of retry procedures by moving to the step 414. In the step 412, the process 400 returns the recovered data to the requester and initiates a procedure in the background flow 204 associated with successful retry procedures.

In the step 414, the process 400 determines whether a higher level redundancy function (e.g., a RAID-like code, etc.) is enabled. Any other coding scheme that is orthogonal to the e-page level ECC can be used, including retry schemes provided by a manufacturer of the particular non-volatile memory. If no other retry procedures are enabled, the process 400 moves to the step 416 and returns an uncorrectable error message to the requester. The step 416 also initiates a procedure in the background flow 204 associated with unsuccessful retry procedures. If a higher level redundancy function is enabled, the process 400 moves to the step 418 where the higher level redundancy function(s) is(are) performed. When the higher level redundancy function(s) has(ve) been performed, the process 400 moves to the step 420 where a determination is made whether the step 418 was successful in recovering the data. If the recovery was successful, the process 400 moves to the step 412. Otherwise, the process 400 moves to the step 416.

Figure 6:
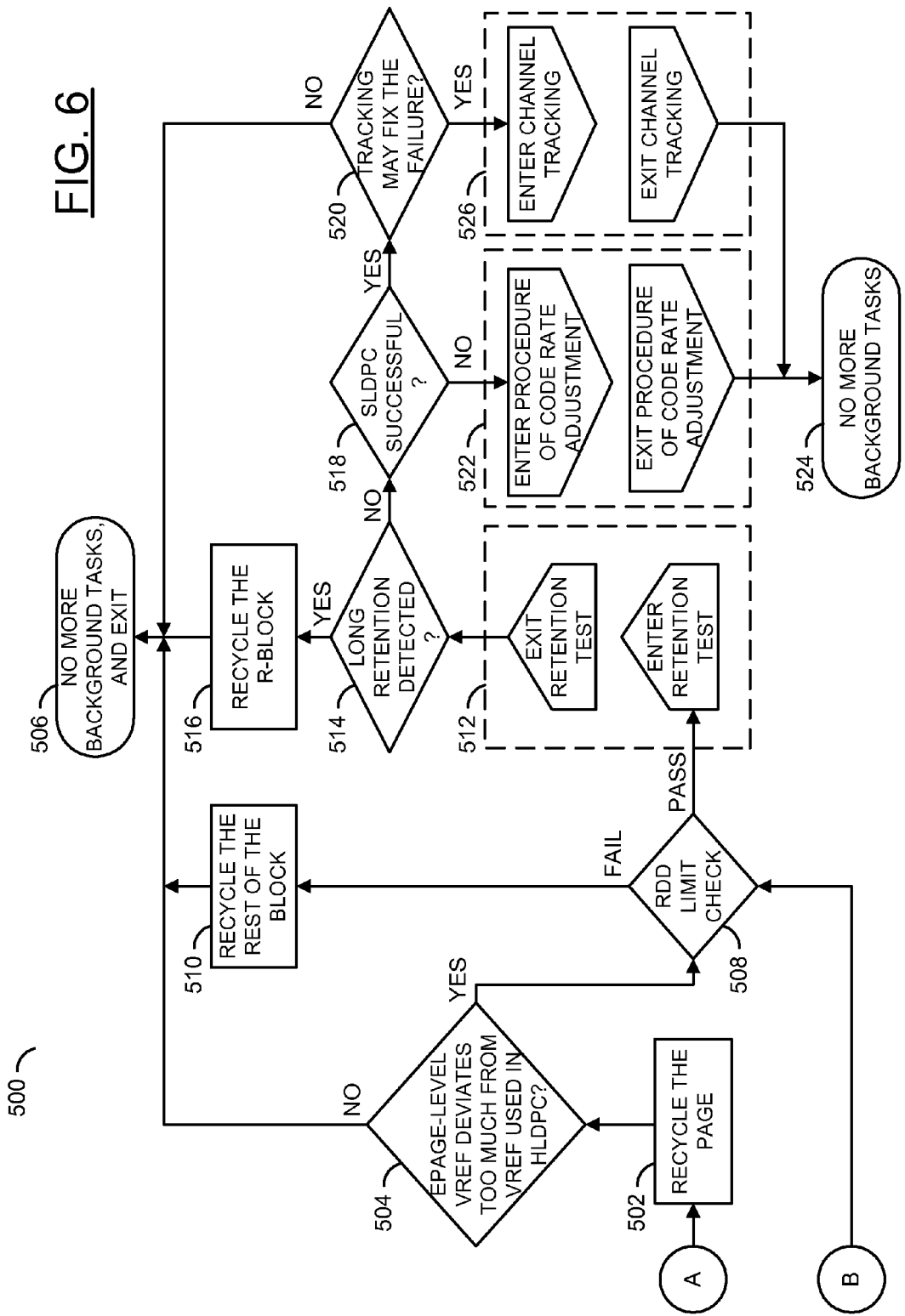
FIG. 6 is a diagram illustrating a background process in accordance with an embodiment of the invention.

Referring to FIG. 6, a flow diagram of a process 500 is shown illustrating a background flow of a read policy in accordance with an embodiment of the invention. In some embodiments, the process 500 may comprise a step (or state) 502, a step (or state) 504, a step (or state) 506, a step (or state) 508, a step (or state) 510, a step (or state) 512, a step (or state) 514, a step (or state) 516, a step (or state) 518, a step (or state) 520, a step (or state) 522, a step (or state) 524, and a step (or state) 526. The step 502 is generally initiated when recovery of the data by the foreground flow was successful. In the step 502, the process 500 recycles the e-page and/or page in which the error was detected. The "recycle the page" step is a relatively time-critical background task, because the data to be recycled is most probably already recovered by foreground flow and stored in a buffer (such as buffer 331 in FIG. 4). It is better to use the data right away rather than reading the e-page and/or page again and going through the foreground flow a second time. After setting the page to be recycled, the process 500 moves to the step 504 where a determination is made whether the e-page-level reference voltage (Vref) deviated too much from the Vref used in the step 404 of the foreground flow (e.g., the HLDPC step). If the deviation was not too great, the process 500 moves to the step 506 and exits the background flow. In some embodiments, the e-page-level reference voltage (vref) is determinable as part of step 408 in the foreground flow.

If the deviation was too great, the process 500 moves to the step 508. The step 508 is also initiated when recovery of the data by the foreground flow was not successful. In the step 508, the process 500 performs a read disturb check. For example, the process 500 may check to see whether a read disturb limit (e.g., RDD) parameter of the particular non-volatile memory has been approached and/or exceeded by the block containing the e-page with the error. If the check fails (e.g., the limit has been approached and/or exceeded), the process 500 moves to the step 510, where the rest of the block (that contains the e-page and/or page) is recycled, and then moves to the step 506 where the background flow is exited. If the check passes, the process 500 moves to the step 512.

In the step 512, the process 500 performs a retention test. When the retention test is completed the process 500 moves to the step 514 where a determination is made whether a long retention has been detected. If a long retention is detected, the process 500 moves to the step 516, where the R-block (that contains the block that contains the e-page and/or page) is recycled, and then moves to the step 506 where the background flow is exited. If a long retention has not been detected, the process 500 moves to the step 518, where a determination is made whether the SLDPC procedure (e.g., the step 408) in the foreground flow was successful. If the SLDPC procedure was successful, the process 500 moves to the step 520. If the SLDPC procedure was not successful, the process 500 moves to the step 522 to perform a code rate adjustment procedure, and then moves to the step 524 where the background flow is exited.

In the step 520, the process 500 determines whether tracking may fix the failure. If tracking will not fix the failure, the process 500 moves to the step 506 and the background flow is exited. If tracking will fix the failure, the process 500 moves to the step 526 to perform a channel tracking procedure, and then moves to the step 524 where the background flow is exited. According to various embodiments, tracking is done on the page level, the block level, the R-block level, or a combination thereof. The e-page level optimal Vref and the optimal Vref on the R-block level are used to help decision making in the background flow 204. Details of the retention test, the code rate adjustment procedure, and the channel tracking procedure are not topics of this disclosure. Although not shown, panic procedures following uncorrectable error after all retry efforts fail in the foreground flow may also be implemented.

The terms "may" and "generally" when used herein in conjunction with "is(are)" and verbs are meant to communicate the intention that the description is exemplary and believed to be broad enough to encompass both the specific examples presented in the disclosure as well as alternative examples that could be derived based on the disclosure. The terms "may" and "generally" as used herein should not be construed to necessarily imply the desirability or possibility of omitting a corresponding element.

While the invention has been particularly shown and described with reference to embodiments thereof, it will be understood by those skilled in the art that various changes in form and details may be made without departing from the scope of the invention.

The invention claimed is:

1. An apparatus comprising:
a non-volatile memory; and
a controller operatively coupled to the non-volatile memory and comprising an error correction engine configured to perform error correction on codewords read from the non-volatile memory and, upon error correction failure, to perform one or more retry procedures, wherein the controller is configured to (i) perform read and write operations on the non-volatile memory using the codewords as a unit of read access, (ii) in response to the error correction failure or one or more of the retry procedures not being successful, perform one or more background procedures configured to determine a cause of the error correction failure, (iii) in response to determining the error correction failure is due to transient noise, eliminate the transient noise by recycling on a block or R-block granularity, and (iv) in response to all of the retry procedures not being successful, send an error message.

2. The apparatus according to claim 1, wherein the non-volatile memory and the controller are configured as a solid state drive and the controller is enabled to be operatively coupled to a host system.

3. The apparatus according to claim 1, wherein:
the error correction comprises a hard decision low-density parity-check (HDLDPC) decoding; and
the one or more retry procedures comprise one or more of (i) additional reads with a same or a different reference voltage (Vref), (ii) error correction code (ECC) re-decoding of different decoder inputs, parameters, or both inputs and parameters, (iii) soft decision low-density parity-check (SDLDPC) decoding, (iv) digital signal processing techniques, and (v) a higher-level redundancy function using a redundancy code.

4. The apparatus according to claim 1, wherein the one or more background procedures comprise
noise source identification.

5. The apparatus according to claim 4, wherein the noise source identification comprises one or more of:
a procedure to determine whether an R-block suffers from long retention; and
a procedure to determine whether a block suffers from an amount of read disturb greater than a predetermined threshold.

6. The apparatus according to claim 4, wherein the noise source identification comprises one or more procedures to differentiate between error correction failures due to transient noise and error correction failures due to non-transient noise.

7. The apparatus according to claim 1, wherein the recycling on a block or R-block granularity involves erasing the block or R-block.

8. The apparatus according to claim 6, wherein the controller is configured to mitigate the non-transient noise by at least one of tracking of channel parameters and lowering code rate.

9. The apparatus according to claim 6, wherein the controller is further configured to eliminate the non-transient noise by retiring a block or R-block that had the error correction failure.

10. A method of managing data in a non-volatile storage system comprising the steps of
reading a first data entry and error correction code (ECC) information associated with the first data entry;
performing an error correction procedure on the first data entry and the ECC information associated with the first data entry;
if the error correction fails, performing one or more retry procedures;
sending an error message in response to all of the retry procedures not being successful;
performing one or more background procedures in response to at least one of the retry procedures being successful, wherein the one or more background procedures are performed by the non-volatile storage system to determine a cause of the error correction failure; and
upon determining the error correction failure is due to transient noise, enabling the non-volatile storage system to eliminate the transient noise by recycling on a block or R-block granularity.

11. The method according to claim 10, wherein the non-volatile storage system comprises at least one of:
a controller and a flash memory module made up of a plurality of flash memory devices;

a controller comprising a plurality of processors operatively coupled to a flash memory module made up of a plurality of flash memory devices; and a controller operatively coupled (i) to a host via a host interface circuit and (ii) to a flash memory module made up of a plurality of flash memory devices via a flash interface circuit.

12. The method according to claim 10, wherein:

the error correction procedure comprises a hard decision low-density parity-check (HDLDPC) decoding; and the one or more retry procedures comprise one or more of (i) additional reads with a same or a different reference voltage (Vref), (ii) ECC re-decoding of different decoder inputs, parameters, or both inputs and parameters, (iii) soft decision low-density parity-check (SDLDPC) decoding, (iv) digital signal processing techniques, and (v) a higher-level redundancy function using a redundancy code.

13. The method according to claim 10, wherein the one or more background procedures comprise identifying a noise source.

14. The method according to claim 13, wherein identifying the noise source comprises one or more of:

determining whether an R-block suffers from long retention; and determining whether a block suffers from an amount of read disturb greater than a predetermined threshold.

15. The method according to claim 13, wherein identifying the noise source comprises performing one or more procedures to differentiate between error correction failures due to transient noise and error correction failures due to non-transient noise.

16. The method according to claim 10, wherein the recycling on a block or R-block granularity involves erasing the block or R-block.

17. The method according to claim 15, further comprising enabling a controller to eliminate the non-transient noise by at least one of tracking of channel parameters, retiring a block or R-block that had the error correction failure, and lowering code rate.

18. The apparatus according to claim 1, wherein:

the controller is further configured to retire a portion of the non-volatile memory associated with the error correction failure when the cause of the error correction failure is determined to be non-transient noise.

19. The apparatus according to claim 4, wherein the one or more background procedures further comprise one or more of:

page-level recycling;

identification of page-to-page variation; and code rate adjustment.

20. The method according to claim 13, wherein the one or more background procedures further comprise one or more of:

page-level recycling;

identifying page-to-page variation; and adjusting a code rate.

* * * * *